US 6,713,361 B2

(12) United States Patent
Nawaz et al.

(10) Patent No.: US 6,713,361 B2
(45) Date of Patent: Mar. 30, 2004

(54) METHOD OF MANUFACTURING A BIPOLAR JUNCTION TRANSISTOR INCLUDING UNDERCUTTING REGIONS ADJACENT TO THE EMITTER REGION TO ENLARGE THE EMITTER REGION

(75) Inventors: Samuel Z. Nawaz, Plano, TX (US); Jeffrey E. Brighton, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/952,414

(22) Filed: Sep. 14, 2001

(65) Prior Publication Data

US 2002/0039815 A1 Apr. 4, 2002

Related U.S. Application Data

(60) Provisional application No. 60/235,619, filed on Sep. 27, 2000.

(51) Int. Cl.$^7$ .................. H01L 21/331; H01L 21/8222
(52) U.S. Cl. .................. 438/309; 438/336; 438/339; 438/349; 438/362; 438/366; 438/367; 438/388
(58) Field of Search ................... 438/309, 336, 438/339, 349, 362, 366, 367, 368

(56) References Cited

U.S. PATENT DOCUMENTS 5,019,525 A * 5/1991 Virkus et al. ............... 438/311
5,221,857 A * 6/1993 Kano ........................ 257/539
5,648,279 A * 7/1997 Imai .......................... 438/202
5,843,828 A * 12/1998 Kinoshita ................... 438/367

FOREIGN PATENT DOCUMENTS

EP          606001 A2 *  7/1994

OTHER PUBLICATIONS

B.Van Schravendijk, et al., "Thin Base Formation by Double Diffused Polysilicon Technology," *IEEE 1988 Bipolar Circuits & Technology Meeting*, Paper 6.6, 88CH2592–4, pp. 132–135.
G. P. Li, et al., "An Advanced High–Performance Trench–Isolated Self–Aligned Bipolar Technology," *IEEE Transactions on Electron Devices*, vol. ED–34, No. 11, Nov. 1987, ©1987 IEEE, pp. 2246–2253.

* cited by examiner

Primary Examiner—W. David Coleman
Assistant Examiner—William M. Brewster
(74) Attorney, Agent, or Firm—Peter K. McLarty; W. James Brady, III; Frederick J. Telecky, Jr.

(57) ABSTRACT

According to one embodiment of the invention, a method for manufacturing bipolar junction transistors includes disposing a first oxide layer between a semiconductor substrate and a base polysilicon layer, forming a dielectric layer outwardly from the base polysilicon layer, and forming an emitter region by removing a portion of the dielectric layer and a portion of the base polysilicon layer. The method further includes removing a portion of the first oxide layer to form undercut regions adjacent the emitter region and to enlarge the emitter region, and forming an oxide pad outwardly from the semiconductor substrate in the emitter region.

14 Claims, 4 Drawing Sheets

US 6,713,361 B2

METHOD OF MANUFACTURING A BIPOLAR JUNCTION TRANSISTOR INCLUDING UNDERCUTTING REGIONS ADJACENT TO THE EMITTER REGION TO ENLARGE THE EMITTER REGION

This application claims priority under 35 USC §119(e)(1) of provisional application Serial No. 60/235,619, filed Sep. 27, 2000.

TECHNICAL FIELD OF THE INVENTION

This invention relates generally to the field of semiconductor devices and, more specifically, to a method for manufacturing a bipolar junction transistor.

BACKGROUND OF THE INVENTION

Semiconductor devices are used for many applications, and one component used extensively in semiconductor devices is a transistor. There are many different types of transistors, including a bipolar junction transistors. Bipolar junction transistors can be used to make other types of transistors or devices, such as super self-aligned transistors, which are the most efficient bipolar structures to maximize performance.

Many processes are used to manufacture super self-aligned transistors. One such process is etching. For example, etching is used in the manufacturing of super self-aligned transistors to etch polysilicon on single crystal silicon. The etching of polysilicon on single crystal silicon is extremely difficult and ends up in a very small operating process window. A problem with the etching of polysilicon on single crystal silicon is that over-etching or under-etching may occur. Over-etching or under-etching hurts reliability of super self-aligned transistors and reduces yield.

Therefore, semiconductor manufacturers desire a method of etching polysilicon on single crystal silicon that substantially reduces or eliminates over-etching or under-etching.

SUMMARY OF THE INVENTION

The challenges in the field of semiconductor devices continue to increase with demands for more and better techniques having greater flexibility and adaptability. Therefore, a need has arisen for a new method for manufacturing a bipolar junction transistor.

In accordance with the present invention, a method for manufacturing a bipolar junction transistor is provided that addresses disadvantages and problems associated with previously developed methods.

According to one embodiment of the invention, a method for manufacturing bipolar junction transistors includes disposing a first oxide layer between a semiconductor substrate and a base polysilicon layer, forming a dielectric layer outwardly from the base polysilicon layer, and forming an emitter region by removing a portion of the dielectric layer and a portion of the base polysilicon layer. The method further includes removing a portion of the first oxide layer to form undercut regions adjacent the emitter region and to enlarge the emitter region, and forming an oxide pad outwardly from the semiconductor substrate in the emitter region.

Embodiments of the invention provide numerous technical advantages. For example, a technical advantage of one embodiment of the present invention is that a process margin for over-etching is provided by utilizing selective oxidation to form an etch stop where polysilicon is to be etched on single crystal silicon. Another technical advantage of one embodiment of the present invention is that the etch stop substantially reduces or eliminates under-etching, as well as over-etching, thereby increasing the reliability and yield of semiconductor devices having bipolar junction transistors.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EMBODIMENTS OF THE INVENTION

Figure 1:
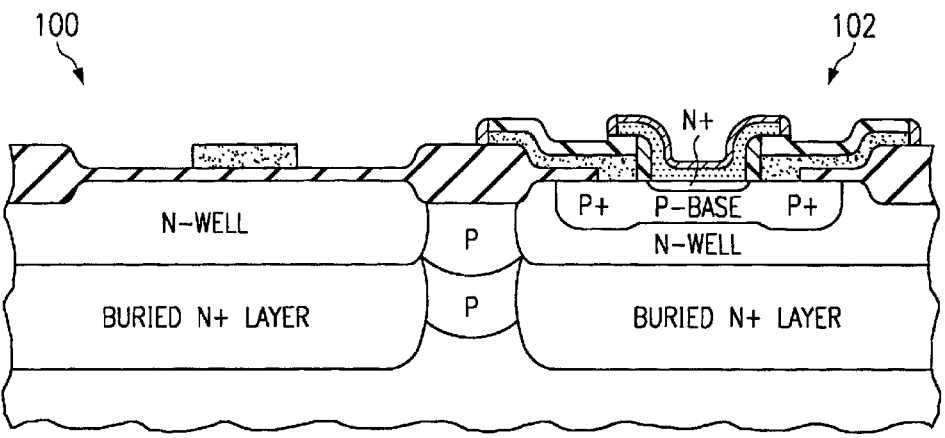
FIG. 1 is a cross-sectional view of a partially completed semiconductor device showing a substantially completed bipolar junction transistor manufactured according to the teachings of the present invention.
Figure 2A:
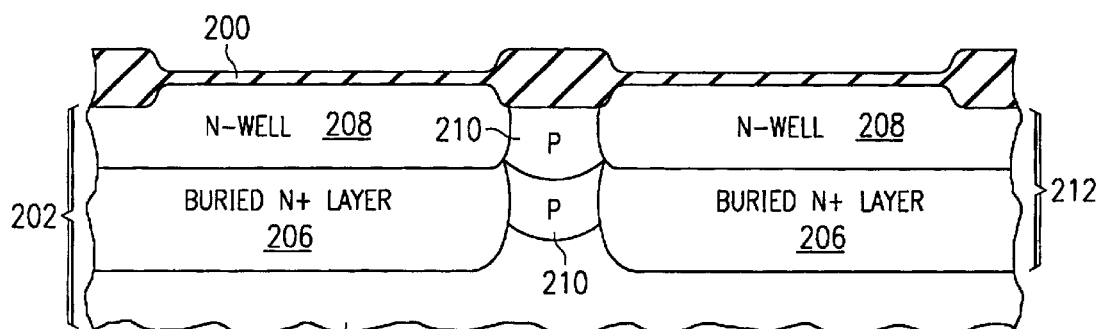
FIGS. 2A through 2L is a series of cross-sectional views illustrating various manufacturing stages of a bipolar junction transistor in accordance with the teachings of the present invention.
Figure 2B:
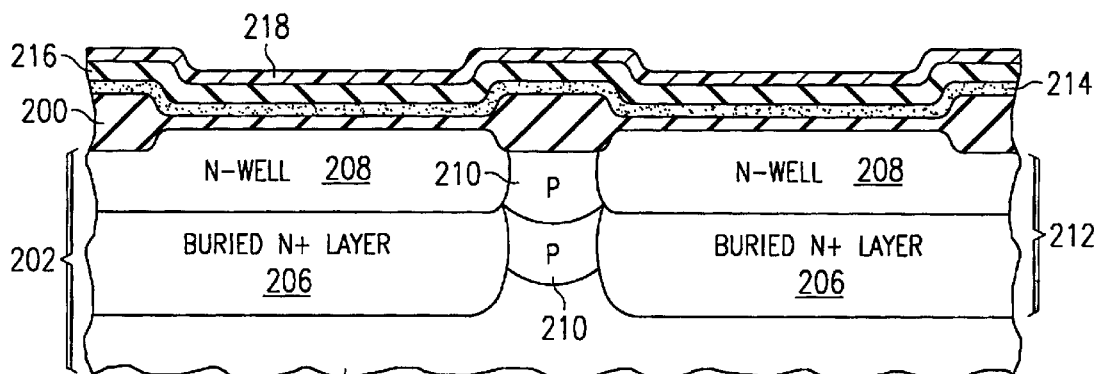
Figure 2C:
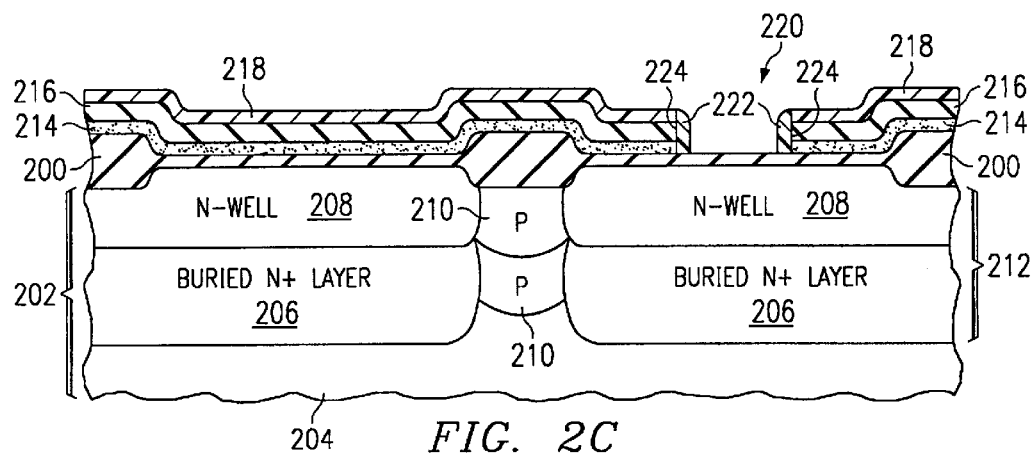
Figure 2D:
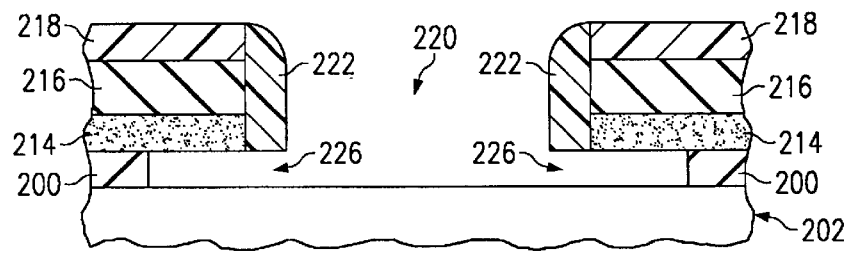
Figure 2E:
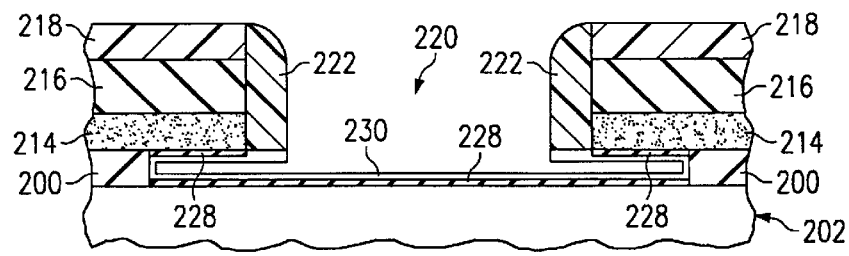
Figure 2F:
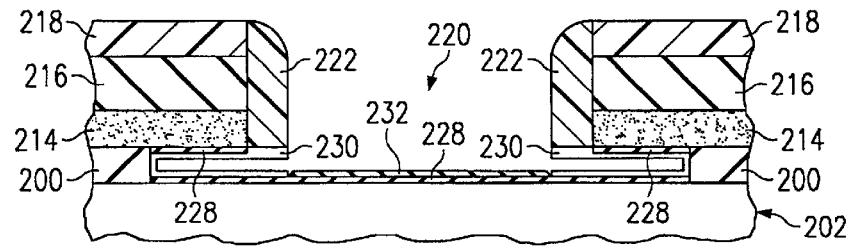
Figure 2G:
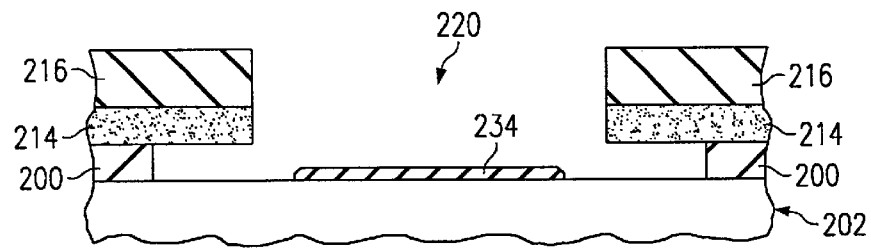
Figure 2H:
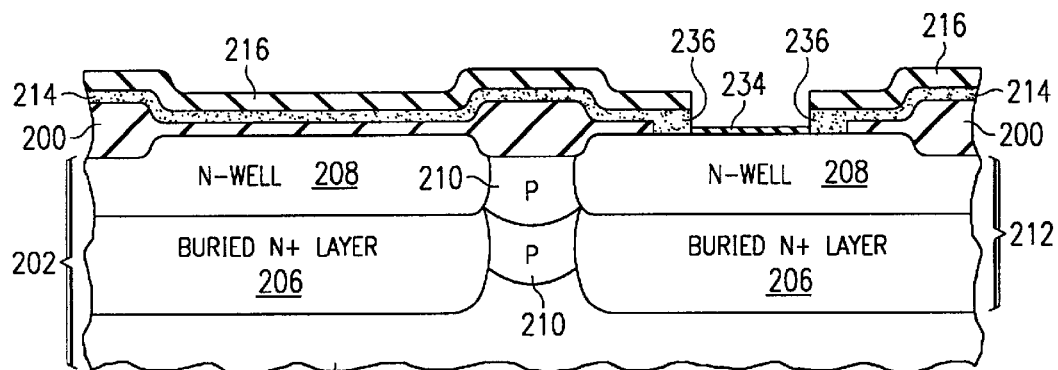
Figure 2I:
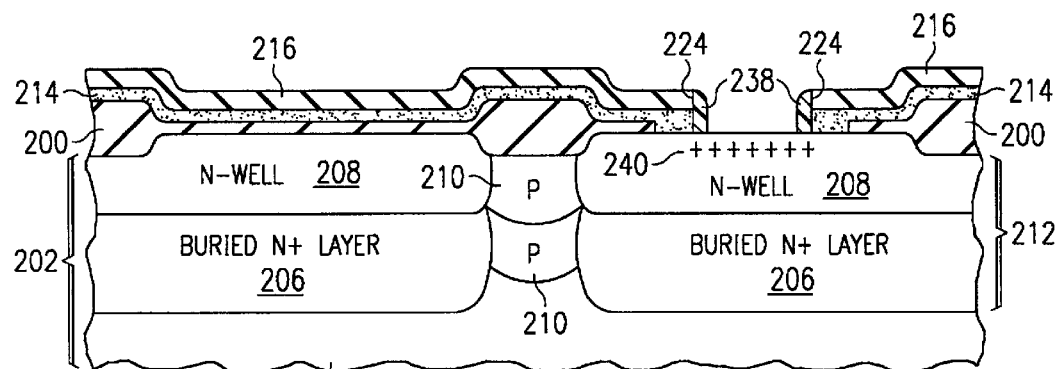
Figures 2J, 2K, 2L:
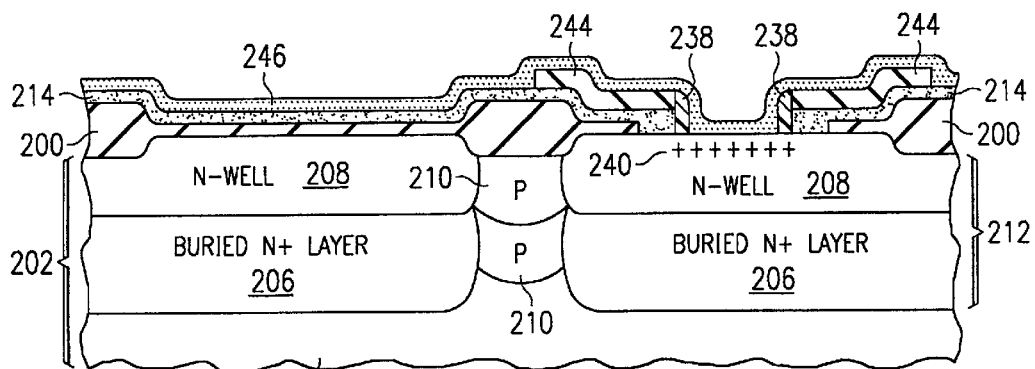

Embodiments of the present invention and their advantages are best understood by referring now to FIGS. 1 through 2L of the drawings, in which like numerals refer to like parts.

FIG. 1 is a cross sectional view of a partially completed semiconductor device 100 showing a substantially completed bipolar junction transistor ("BJT") 102 manufactured according to the teachings of the present invention. BJT 102 is shown in FIG. 1 to be a vertical N-P-N bipolar junction transistor; however, BJT 102 may be formed in other configurations such as a P-N-P configuration. Many processes are used in manufacturing bipolar junction transistors; one such process is etching. Etching is a process for removing material in a specified area through a wet or dry chemical reaction or by physical removal. Polysilicon is often etched during formation of a semiconductor device. Some etching of polysilicon takes place over single crystal silicon, but stopping the etch accurately is extremely difficult. Over-etching or under-etching may occur, thus hurting reliability and yield issues. Over-etching occurs where the material to be removed is completely removed as well as some of the material underneath, thereby creating a hole or void. Under-etching occurs where not enough of the material is removed. The present invention addresses these problems by providing a method for manufacturing BJT 102. One embodiment of such a method is illustrated in FIGS. 2A–2L.

FIGS. 2A–2L are a series of cross-sectional views illustrating various manufacturing stages of BJT 102 in accordance with the teachings of the present invention.

FIG. 2A shows a first oxide layer 200 formed outwardly from semiconductor substrate 202. First oxide layer 200 may be any type of oxide, and may be formed using any growth or deposition techniques conventionally used in semiconductor processing. In one embodiment, first oxide layer 200 is approximately 1400 angstrom thick; however, other thicknesses may be used. Semiconductor substrate 202, in one embodiment, comprises a P-type substrate 204, a buried $N^+$ layer 206, an N-well 208, and P-type isolation regions 210. However, semiconductor substrate 202 may comprise other types of doped regions depending on the type of transistor being fabricated. Buried N+ layer 206 and N-well 208 forms a collector 212, which is the collector for BJT 102. The outside contact for collector 212 is not shown in FIG. 2A for clarity.

FIG. 2B shows a base polysilicon layer 214 formed outwardly from semiconductor substrate 202, a second oxide layer 216 formed outwardly from base polysilicon layer 214, and a first nitride layer 218 formed outwardly from second oxide layer 216. Base polysilicon layer 214 is polysilicon used for a contact of the base of BJT 102, as described below. In the embodiment shown in FIG. 2B, base polysilicon layer 214 is a P-type polysilicon; however, base polysilicon layer 214 may also be an N-type polysilicon layer. Base polysilicon layer 214 may be any desired thickness and may be formed using any suitable layering techniques used in semiconductor processing. Second oxide layer 216 may be formed from any type of oxide, and may be formed using any suitable growth or deposition technique used in semiconductor processing. Similarly, first nitride layer 218 may be any type of nitride, and may be formed using any suitable growth or deposition technique used in semiconductor processing. Both second oxide layer 216 and first nitride layer 218 may be any desired thickness.

FIG. 2C shows an emitter region 220 formed by removing a portion of base polysilicon layer 214, second oxide layer 216, and first nitride layer 218. This removal may be accomplished by an etch process. A contact for the emitter of BJT 102 will be formed in emitter region 220. Emitter region 220 has a second nitride layer 222 formed on sidewalls 224. A portion of first oxide layer 200 forms a base of emitter region 220. A portion of first oxide layer 200 that forms the base of emitter 220 acts as an etch stop for the etching of base polysilicon layer 214, thus preventing over-etching or under-etching, resulting in a technical advantage of one embodiment of the present invention.

FIG. 2D is an expanded view of emitter region 220 showing a portion of first oxide layer 200 removed to expose semiconductor substrate 202, and to form undercut regions 226 adjacent to emitter region 220. First oxide layer 200 may be removed using an etch process, in which an oxide etchant such as hydrofluoric acid is used so that first and second nitride layers 218, 222 stay intact. Polysilicon will be deposited in undercut regions 226 so that base polysilicon layer 214 may contact the base of BJT 102, as described below. This means that polysilicon needs to fill undercut regions 226, which means polysilicon is deposited in both undercut regions 226 and emitter region 220 and thereafter etched, as described more fully below. To avoid etching polysilicon on top of single crystal silicon, selective oxidation is utilized to form an etch stop at the base of emitter region 220. The process of forming an etch stop is shown in FIGS. 2E–2G.

FIG. 2E shows a third oxide layer 228 formed outwardly from semiconductor substrate 202 in emitter region 220 and undercut regions 226, and formed inwardly from first oxide layer 200 in undercut regions 226. Third oxide layer may be formed from any type of oxide, and may be formed using any suitable growth or deposition techniques used in semiconductor processing. In one embodiment, third oxide layer 228 is approximately 200 angstroms; however, other thicknesses may be used. FIG. 2E also shows a third nitride layer 230 formed on third oxide layer 228. Third nitride layer 230 may be formed from any type of nitride, and may be formed using any conventional growth or deposition techniques used in semiconductor processing.

FIG. 2F illustrates a fourth oxide layer 232 formed outwardly from a portion of third oxide layer 228 at the base of emitter region 220. Third nitride layer 230 is anisotropically etched at the base of emitter region 220 so that fourth oxide layer 232 can be formed directly on third oxide layer 228. In essence, fourth oxide layer 232 is thickening third oxide layer 228. Fourth oxide layer 232 may be formed from any type of oxide, and may be formed using any suitable growth or deposition techniques used in the semiconductor processing. In one embodiment, fourth oxide layer 232 is approximately 600 angstroms thick; however, other thicknesses may be used. The ratio of fourth oxide layer 232 to third oxide layer 228 may be anywhere from 1:1 to 6:1. In one embodiment, the ratio is approximately 3:1.

FIG. 2G shows oxide pad 234 at the base of emitter region 220. Oxide pad 234 may be formed from any type of oxide, and may be formed using any suitable growth or deposition techniques. Oxide pad 234 is formed by removing first nitride layer 218, second nitride layer 222, and third nitride layer 230, as well as removing third oxide layer 228 in undercut regions 226 and at least a portion of fourth oxide layer 232. In one embodiment, oxide pad 234 is approximately 400 angstroms thick; however, oxide pad 234 may be other thicknesses. Oxide pad 234 is utilized as an etch stop for the etching of polysilicon that is deposited in undercut regions 226 and emitter region 220 to couple base polysilicon layer 214 and the base of BJT 102 (not shown). Oxide pad 234 eliminates any over-etching or under-etching that occurs without the use of an etch stop.

FIG. 2H shows base polysilicon layer 214 coupled to semiconductor substrate 202 with first polysilicon regions 236. First polysilicon regions 236 are formed by depositing sufficient polysilicon to fill undercut regions 226. The depositing of polysilicon in undercut regions 226 causes some polysilicon to form in emitter region 220. Any polysilicon deposited in emitter region 220 is etched away with oxide pad 234 acting as an etch stop. Thus, oxide pad 234 provides a process margin for over-etching by acting as an etch stop where polysilicon is to be etched on single crystal silicon. In addition, oxide pad 234 substantially reduces or eliminates under-etching, as well as over-etching, thereby increasing the reliability and yield of semiconductor devices having bipolar junction transistors.

FIG. 2I shows a boron implant 240 formed in N-well 208. Boron implant 240 is used to link-up polysilicon regions 236 and is also the basis for the formation of a P-base region 242 as illustrated in FIG. 2K. FIG. 2I also shows a fifth oxide layer 238 formed on sidewalls of emitter region 220. Fifth oxide layer 238 may be formed from any type of oxide, and may be formed using any suitable growth or deposition techniques. FIG. 2I also shows that oxide pad 234 has been removed, for example, by an etching process. Once oxide pad 234 is removed, the rest of the manufacturing of BJT 102 proceeds according to well known techniques, such as those shown in FIGS. 2J–2L.

FIG. 2J illustrates a base oxide region 244 formed outwardly from first polysilicon layer 214, and a second polysilicon layer 246 formed outwardly from base oxide region 244. Base oxide region 244 is formed from the removal of a portion of second oxide layer 216.

FIG. 2K shows a second polysilicon region 248 formed in emitter region 220. Second polysilicon region 248 is formed from second polysilicon layer 246 and forms the contact for the emitter of BJT 102. In the embodiment shown, second polysilicon region 248 is an N-type polysilicon; however, a P-type polysilicon may be used depending on what type of transistor is fabricated. FIG. 2K also shows P+ regions 250 formed in P-base region 242 for better contact with polysilicon regions 236.

FIG. 2L shows a sixth oxide layer 252 formed outwardly from second polysilicon region 248 and adjacent to base oxide region 244. FIG. 2L also shows an N+ region 254 that comprises the emitter of BJT 102. This substantially completes the manufacturing of BJT 102 in accordance with the present invention.

In its substantially completed form, as shown in FIG. 2L, BJT 102 comprises a collector 212 formed from buried N+ layer 206 and N-well 208, a base formed from P-base region 242 and P+ regions 248, and an emitter formed from N+ region 254. Base polysilicon layer 214 forms the contact for the base of BJT 102, while second polysilicon region 248 forms the contact for the emitter of BJT 102. As discussed above, the contact for collector 212 is not shown for clarity.

Although embodiments of the invention and their advantages are described in detail, a person skilled in the art could make various alternations, additions, and omissions without departing from the spirit and scope of the present invention as defined by the appended claims.

What is claimed is:

1. A method of forming a bipolar junction transistor structure, comprising:

disposing a first oxide layer between a semiconductor substrate and a base polysilicon layer;

forming a dielectric layer outwardly from the base polysilicon layer;

forming an emitter region by removing a portion of the dielectric layer and a portion of the base polysilicon layer;

removing a portion of the first oxide layer to form undercut regions adjacent the emitter region and to enlarge the emitter region;

forming a second oxide layer on all surfaces of the undercut regions and outwardly from the semiconductor substrate in the emitter region;

forming a second nitride layer on the second oxide layer;

anisotropically etching the second nitride layer in the emitter region to expose a portion of the second oxide layer; and forming a third oxide layer outwardly from the portion of the second oxide layer in the emitter region.

2. The method of claim 1, wherein forming the second oxide layer and the third oxide layer comprises forming a ratio of the third oxide layer thickness to the second oxide layer thickness between 2:1 and 5:1.

3. The method of claim 1, wherein forming the second oxide layer and the third oxide layer comprises forming a ratio of the third oxide layer thickness to the second oxide layer thickness of approximately 3:1.

4. A method used in forming an intermediate structure in a bipolar junction transistor, comprising:

disposing a first oxide layer between a semiconductor substrate and a base polysilicon layer;

forming a dielectric layer outwardly from the base polysilicon layer;

forming an emitter region having sidewalls by removing a portion of the dielectric layer and a portion of the base polysilicon layer;

forming a first nitride layer on the sidewalls of the emitter region;

removing a portion of the first oxide layer to form undercut regions adjacent the emitter region and to enlarge the emitter region thereby exposing the semiconductor substrate;

forming a second oxide layer on all surfaces of the undercut regions and outwardly from the semiconductor substrate in the emitter region;

forming a second nitride layer on the second oxide layer;

anisotropically etching the second nitride layer in the emitter region to expose a portion of the second oxide layer;

forming a third oxide layer outwardly from the portion of the second oxide layer in the emitter region;

removing the first and second nitride layers;

coupling the base polysilicon layer with the semiconductor substrate by forming a second polysilicon layer in the cavities;

forming a fourth oxide layer on the sidewalls of the emitter region; and removing the oxide pad.

5. The method of claim 4, wherein disposing the first oxide layer comprises depositing oxide having a thickness of between 1000 and 2000 angstrom.

6. The method of claim 4, wherein disposing the first oxide layer comprises forming the semiconductor substrate with a p-type substrate and a collector region, wherein the collector region comprises an n+layer formed in the p-type substrate, and an n-well formed in the p-type substrate and formed outwardly from the n+layer.

7. The method of claim 6, further comprising implanting boron in the n-well to form a p-type base region.

8. The method of claim 4, wherein forming the second oxide layer comprises depositing oxide having a thickness between 100 and 300 angstrom.

9. The method of claim 4, wherein forming the third oxide layer comprises depositing oxide having a thickness between 200 and 1500 angstrom.

10. The method of claim 4, wherein forming the second oxide layer and the third oxide layer comprises forming a ratio of the third oxide layer thickness to the second oxide layer thickness between 2:1 and 5:1.

11. The method of claim 4, wherein forming the second oxide layer and the third oxide layer comprises forming a ratio of the third oxide layer thickness to the second oxide layer thickness of approximately 3:1.

12. A method for manufacturing a bipolar junction transistor, comprising:

forming a first oxide layer outwardly from a semiconductor substrate;

forming a base polysilicon layer outwardly from the first oxide layer;

forming a second oxide layer outwardly from the first polysilicon layer;

forming a first nitride layer outwardly from the second oxide layer;

etching a portion of the first nitride layer, the second oxide layer, and the base polysilicon layer to form an emitter region having sidewalls, wherein a portion of the first oxide layer forms a base of the emitter region;

forming a second nitride layer on the sidewalls of the emitter region;

etching the first oxide layer to remove the base of the emitter region thereby exposing the semiconductor substrate, and to form undercut regions adjacent the emitter region, the undercut regions disposed between the semiconductor substrate and the base polysilicon layer;

forming a third oxide layer outwardly from the semiconductor substrate in the emitter region and the undercut regions, and inwardly from the base polysilicon layer in the undercut regions;

forming a third nitride layer on the third oxide layer;

anisotropically etching the third nitride layer in the emitter region to expose a portion of the third oxide layer;

forming a fourth oxide layer outwardly from the portion of the third oxide layer in the emitter region;

removing the first, second, and third nitride layers;

etching the third oxide layer in the undercut regions and at least a portion of the fourth oxide layer thereby leaving an oxide pad disposed outwardly from the semiconductor substrate in the emitter region;

coupling the base polysilicon layer with the semiconductor substrate by forming a first polysilicon layer in the undercut regions;

forming a fifth oxide layer on the sidewalls of the emitter region;

removing the oxide pad; and forming a second polysilicon layer in the emitter region.

13. The method of claim 12, wherein forming the first oxide layer comprises depositing oxide having a thickness of between 1000 and 2000 angstrom.

14. The method of claim 12, wherein forming the third oxide layer and the fourth oxide layer comprises forming a ratio of the fourth oxide layer thickness to the third oxide layer thickness between 2:1 and 5:1.

* * * * *